(12) United States Patent
Suzuki

(10) Patent No.: US 6,462,552 B1
(45) Date of Patent: Oct. 8, 2002

(54) APPARATUS FOR MEASURING ELECTRIC CHARGE

(75) Inventor: Kouichi Suzuki, Tokyo (JP)

(73) Assignee: NEC Corporation (JP)

( * ) Notice: Subject to any disclaimer, the term of this patent is extended or adjusted under 35 U.S.C. 154(b) by 17 days.

(21) Appl. No.: 09/691,587

(22) Filed: Oct. 18, 2000

(30) Foreign Application Priority Data

Oct. 20, 1999 (JP) .......................................... 11-298797

(51) Int. Cl.[7] .......................... G01R 29/12; G01R 31/02
(52) U.S. Cl. .......................... 324/458; 324/457; 324/72
(58) Field of Search ................................. 324/457, 458, 324/454, 455, 72, 452; 399/73

(56) References Cited

U.S. PATENT DOCUMENTS 4,270,090 A  *  5/1981  Williams ..................... 324/457
5,270,660 A  * 12/1993  Werner et al. .............. 324/457

FOREIGN PATENT DOCUMENTS

JP          07104019 A       4/1995     ........... G01R/29/12
JP          07325119 A      12/1995     ........... G01R/29/24

* cited by examiner

*Primary Examiner*—N. Le
*Assistant Examiner*—James Kerveros
(74) *Attorney, Agent, or Firm*—Hayes Soloway P.C.

(57) ABSTRACT

The electrometer includes an external electrical conductor, a surface electrometer, an inner electrical conductor, an amplifier circuit, and a control section. The external electrical conductor has a first section for probing an electric potential of an object of interest and a second section adapted for contacting said object. The surface electrometer detects a potential of the first section. The inner electrical conductor is isolated from the external electrical conductor, supports the surface electrometer and shields it from an external electric field. The amplifier circuit converts the output of the surface electrometer into a low-impedance signal and amplifies it. The control section computes the electrical potential of the object based on the output of the amplifier circuit. The first section is configured to adapt to a measurement by the surface electrometer.

10 Claims, 4 Drawing Sheets

APPARATUS FOR MEASURING ELECTRIC CHARGE

BACKGROUND OF THE INVENTION

1. Field of the Invention

The present invention relates to an apparatus for measuring an electrostatic potential or charge and particularly to an apparatus for measuring an electrostatic charge borne on a semiconductor device.

2. Description of the Related Art

A semiconductor device is commonly produced by forming a plurality of semiconductor devices on a substrate of Si (silicon) or GaAs (gallium arsenide); sawing or machining the substrate into individual semiconductor devices (each referred to as a die) by the dicing process; mounting the die in a package and connecting electrodes formed on the die to external leads using gold wires; and finally completing the manufacturing procedure by sealing the package in resin, for example.

Quality deficiencies in semiconductor devices have been caused by failures in the processes of forming semiconductor devices on a substrate: for example, failure in the photolithography to form a pattern of a designed size; and penetration fault of a contact hole to be penetrated through an insulator layer to connect upper and lower wiring layers.

Recently, the tendency toward decreasing a size of a semiconductor device has carried about a deteriorated immunity from static electricity of a semiconductor device. As a result, quality deficiencies caused by the static electricity have increased in addition to those caused by faulty processes as described above.

In order to track the sources of the deficiencies, the present inventor et al. have disclosed an apparatus for measuring an electrostatic charge using a coulomb meter in Japanese Patent Laid-open No. H07-325119.

The measuring apparatus will be set forth with reference to the drawings below.

FIG. 1 is a schematic diagram of the apparatus described in the quoted literature. A dielectric substance 4 of a known dielectric constant surrounds a metal rod 14. Grounded metal plate 15 covers dielectric substance 14.

The wiring arranged between an object to be measured and dielectric substance 4 is positionally fixed with respect to dielectric substance 4 to keep the relative position unchanged, thereby preventing measured values from being varied by a deformation of the wiring. Since metal plate 15 shields metal rod 14 from an external electromagnetic wave, the measurement of the electrostatic charge is not affected by an electromagnetic induction. Furthermore, dielectric material 4 is configured so as to establish a distributed capacity along the path through which the charge to be measured moves. This configuration of dielectric substance 4 allows the distributed capacitor to act as a delay line. Thus, charging of the distributed capacitor propagates successively from the proximity to the object concerned. Consequently, voltmeter 5 is protected from being instantaneously applied with a high voltage of the object 1. In this way, the electrostatic charge in question can be preserved from the leakage that will otherwise occur through voltmeter 5 to the ground.

FIG. 2 represents an example in which the above-described measuring apparatus is applied to the manufacturing process of an LSI.

In this example, an excess mobile electric charge is measured at a lead terminal. Such an electric charge is often generated when LSI 16 is slid on a sloped metal rail 17 and carried from the top to the bottom, as is shown in FIG. 2a).

Such a carrying system has been often employed in a process step of manufacturing an LSI. The measurement is carried out by two procedures: the preliminary procedure and the measurement procedure. The preliminary procedure is performed, as is shown in FIG. 1, by connecting metal plate 15 arranged outermost of the measuring apparatus to the ground potential; connecting voltmeter 5 between the top end of inner metal rod 14 and the ground potential; and sufficiently discharging the capacitor made up of metal rod 14 and metal plate 15 interposed by dielectric substance 4 by short-circuiting metal rod 14 and metal plate 15.

Next, the measurement procedure is carried out, as is shown in enlarged exploded FIG. 2b), by bringing the pointed bottom tip of metal rod 14 into contact with lead terminal 18 of LSI 16 that has slid down on metal rail 17; observing the value indicated in voltmeter 5; and calculating excess mobile electric charge from the equation Q=CV.

Lately, the tendency toward small-sizing a semiconductor device such as an MR head (magneto-resistive head) for reading magnetic data in semiconductor ICs (a DRAM, a processor and a CCD) and a hard-disk has been rapidly advanced.

Small-sizing of semiconductor devices entails high susceptibility to an electrostatic charge created on a semiconductor device while it is manufactured, assembled and practically used. For this reason, it is an urgent need to improve a technique for measuring an electrostatic charge borne on a semiconductor device to protect the device from troubles caused by the electrostatic charge.

In electronic devices since 1997, front-end products have suffered from significant deterioration in electrostatic-charge immunity.

For example, the wiring rule of a large-scale integrated circuit is now reducing to less than 0.25 $\mu$m and will presumably reach 0.18 $\mu$m in 2000. Furthermore, in a field of a semiconductor device as well, the area of each pixel in a picture CCD has been small-sized in order to improve fineness of a picture.

A storing density of a hard disk, on the other hand, has been increased to as high as 5–15 GBit/inch$^2$. This has enabled to realize a small-sized head for read and/or write.

In the field of the liquid crystal display (LCD) as well, an improvement of the resolution has been advanced through small-sizing of a display pixel. As the digital broadcast becomes full-fledged and the high-vision TV becomes widespread in the near future, the pixels in the picture display such as a plasma display will be rendered small-sized. The small-sizing entails susceptibleness to an electrostatic charge.

The minimum quantity of the static electricity that adversely affects the small-sized semiconductor device does not fall within a measurable range of the above-described traditional measuring apparatus. Thus, an improvement of the measuring apparatus is required.

In Southeast Asia where manufacture sites have shifted to as well as in Japan, U.S.A. and Europe, troubles caused by static electricity in manufacture lines and markets have been occurring in rapid succession. Thus, it is an urgent need to dissolve the troubles. For this reason, it is necessary to provide for measurement of an electrostatic charge with improved precision and simplicity.

It is an object of the present invention to provide measuring apparatuses capable of measuring an electrostatic potential of a human body and an electrostatic potential of a metal workbench, neither of which can be measured by the traditional measuring apparatus using a coulomb meter.

It is another object of the present invention to provide a measuring apparatus capable of detecting a state of the ions in the ambient air. It is a further object to obviate troubles caused by an electrostatic charge in a manufacture line comprehensively allowing for the results of the measurements by means of above-described measuring apparatuses.

SUMMARY OF THE INVENTION

In order to achieve the object of the present invention, a first electrometer of the present invention comprises an external electrical conductor, a surface electrometer, an inner electrical conductor, an amplifier circuit and a control section.

The external electrical conductor has two sections: a first section probes an electric potential of an object of interest and a second section is configured to adapt for contacting the object.

The surface electrometer detects an electric potential of the first section.

The inner electrical conductor is isolated from the external electrical conductor and serves for supporting the surface electrometer and shielding it from an external electric field.

The amplifier circuit converts the output of the surface electrometer into a low-impedance signal and amplifies the low-impedance signal. The control section computes the electrical potential of the object based on the output of the amplifier circuit.

The first section is configured to adapt to a measurement by the surface electrometer.

Preferably, the surface electrometer is a noncontact vibrating-capacitor electrometer and the first section is configured as a probe plate to make up a capacitor with a measuring electrode of the noncontact vibrating-capacitor electrometer.

In the case that the object of interest is a human body, the second section of the external electrical conductor is formed to adaptively contact a predetermined portion of a human body, such as a wristband.

In the case that the object of interest is a semiconductor devise under processing in a manufacture line, the second section is preferably formed thin to adaptively contact the object.

The above-described first electrometer of the present invention is directed to detecting an electrostatic potential of an object of interest. For this end, the second section of the external electrical conductor is placed in contact with the object. Since the second section is an electrical conductor, it becomes equipotential to the object when it is brought into contact with the object. Thus, the electrostatic potential of the object is detected by measuring the electrostatic potential of the first section by means of the surface electrometer.

A second electrometer of the present invention is directed to monitoring the concentrations of positive and negative ions in the air.

It comprises: an electrically conductive probe plate supplied with a bias voltage for probing a surface electrostatic charge caused by ambient air ions attracted thereto; an external electrical conductor for shielding the entirety of the electrometer from an external electric field, electrically isolated from the probe plate; a surface electrometer for detecting a surface potential of the probe plate; an inner electrical conductor for supporting the surface electrometer; an amplifier circuit for converting the output of the surface electrometer into a low-impedance signal and amplifying it; and a control section for computing the ion concentration in the ambient air based on the output of the amplifier circuit, wherein the probe plate is configured to have a capacitance with respect to the ground as well as to adapt to a measurement by said surface electrometer, and wherein the ion concentration is determined by detecting the electrostatic potential of the probe plate caused by the surface electrostatic charge.

The procedure to determine the ion concentration comprises the steps of: first applying a high voltage with respect to the ground potential to the probe plate as the bias voltage in order to charge the to-ground capacitance of the probe plate, next cutting off a supply of the high voltage to the probe plate, detecting the values of a decaying voltage in the probe plate by the surface electrometer, computing a decay time of the voltage in the probe plate and identifying the concentration of the ambient air ions based on the decay time by the control section.

When a high voltage, say a positive high voltage, is applied to the probe plate, negative ions are attracted to the probe plate. Because of the potential barrier in the boundary between the probe plate and the air, no charge transfer takes place between the probe plate and the air ions. As a result, electric double layer is formed at the boundary.

This circumstances correspond to the air capacitor made up of the probe plate and the ground interposed with the ambient air as a dielectric which is electrically polarizable under the electric field produced between the probe plate and the ground. This capacitor is referred to, in the present Specification, as a to-ground capacitor with a probe-plate electrode or a to-ground capacitor of the probe-plate, and the capacitance of the to-ground capacitor is referred to as the to-ground capacitance of the probe plate.

Since the number of ions attracted to the probe plate increased as the ion concentration increases, the polarlizability of the dielectric in the to-ground capacitor (the ambient air) increases as the ion concentration increases.

Accordingly, an increase in the ion concentration results in an increase in a dielectric constant of the ambient air, and the increase in the dielectric constant in turn causes an increase in the to-ground capacitance of the probe plate. The increase in the to-ground capacitance further in turn results in an increase in a decay time for a discharge of the to-ground capacitance.

In this way, the measurement of the decay time in the to-ground capacitor enables the identification of the ion concentration in the ambient air.

In order to identify a plus ion concentration and a minus ion concentration individually, it is necessary that a plus high voltage and a minus high voltage are individually applied to the probe plate as a bias voltage. In order to identify a surface charge of an object, the probe plate preferably has a to-ground capacitance substantially the same as that of the object concerned.

A manufacture line preferably includes at least two of the three electrometers in combination: the electrometer for measuring an electric potential of a human body; the electrometer for measuring an electric potential of a semiconductor device; and the electrometer for monitoring an ion concentration in the ambient air (cf. claims 3, 4 and 5).

The above-described at least two electrometer can share the control section. The shared control section can receive data supplied from the individual amplifier circuits, judge comprehensively the received data, and operate to execute a predetermined control based on the comprehensive judgement.

In this way, the present invention enables to eliminate the deficiencies caused by static electricity in a manufacture line even if the manufacture line is for manufacturing and assembling the products susceptible to static electricity.

By taking counter-measures against static electricity at a start-up of the line, the static-electricity-susceptible products thereafter entered into the line can be properly processed solely by revising a predetermined reference value.

By applying the present invention to an assemble line of a hard disk, the deficiencies caused by static electricity, which amount to 65% to 70% of the products, are nearly completely eliminated.

The above and other objects, features and advantages of the present invention will become apparent from the following description referring to the accompanying drawings which illustrate examples of preferred embodiments of the present invention.

BRIEF DESCRIPTION OF DRAWING

FIG. 2 represents an example in which the measuring apparatus shown in FIG. 1 is applied to the manufacturing process of an LSI.

DETAILED EXPLANATION OF THE PREFERRED EMBODIMENTS

Now the embodiments of the present invention will be set forth with reference to the drawings.

A first embodiment of the present invention is a human-body electrometer.

Figure 1:
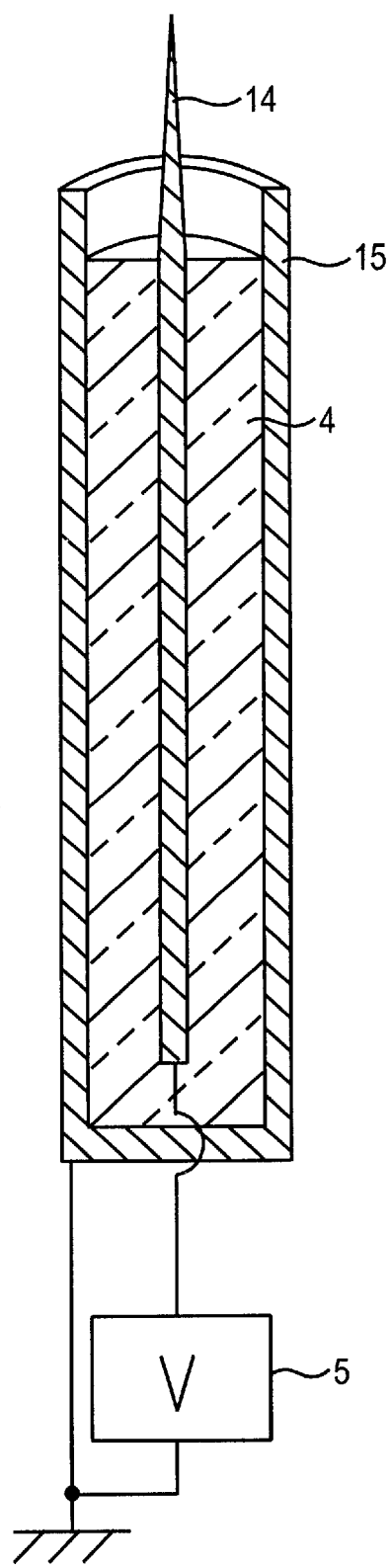
FIG. 1 is a schematic diagram of the prior art electrometer.
Figure 2A:
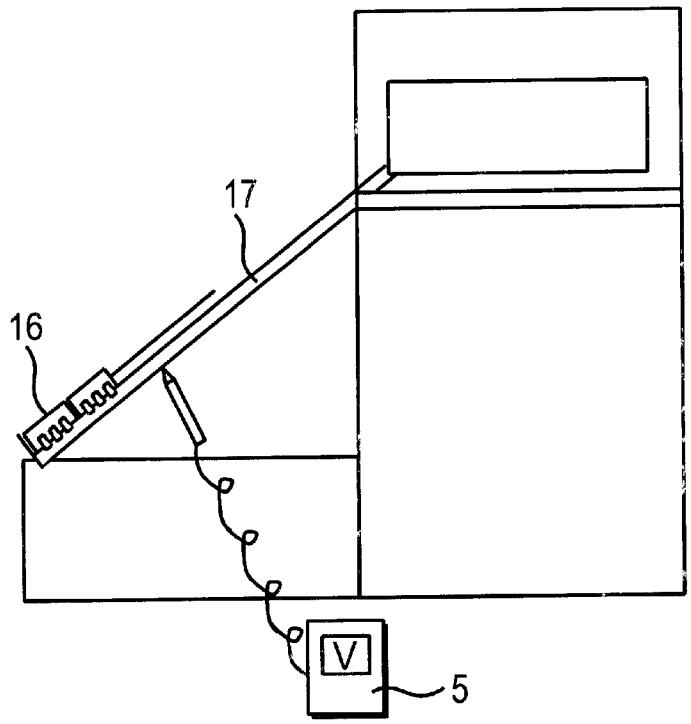
FIGS. 2(a) and 2(b) represent examples in which the measuring apparatus shown in FIG. 1 is applied to the manufacturing process of an LSI.
Figure 2B:
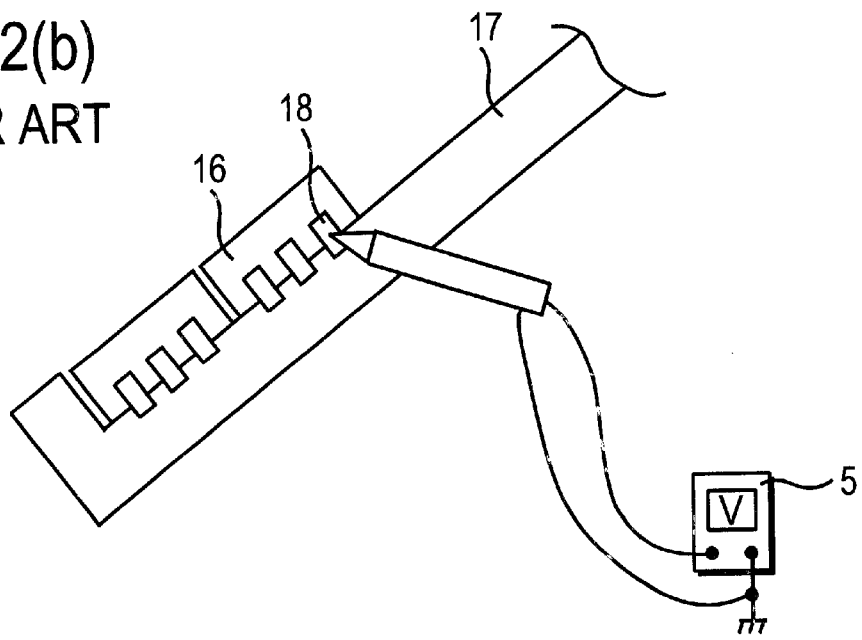
Figure 3:
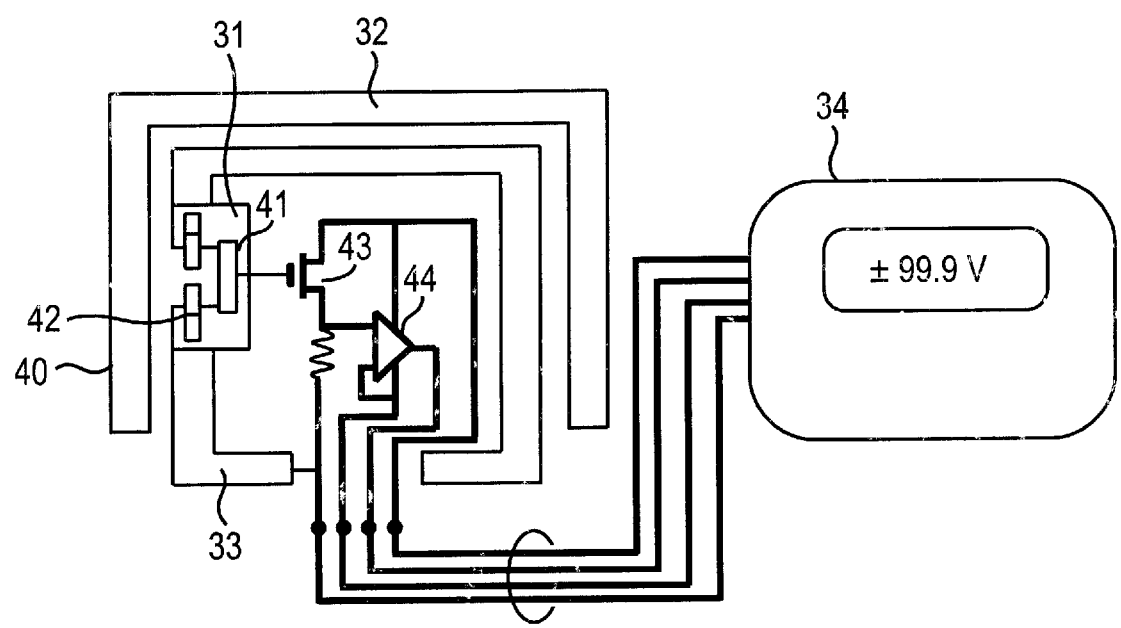
FIG. 3 is a schematic diagram of a first embodiment according to the present invention.

FIG. 3 is a schematic diagram of the human-body electrometer according to the present invention.

The human-body electrometer comprises external electric conductor 32, surface electrometer 31, inner electric conductor 33, an amplifier circuit and control section 34.

An external electric conductor 32 includes at least two sections: a first section for probing an electric potential of an object of interest and a second section adapted for contacting the object. For this purpose, the first section is formed flat and is arranged to face to surface electrometer 31. The second section is preferably formed to adapt to a human body, for example a wrist. Hereinafter, the first section of external conductor 31 is referred to as a probe plate 40.

Surface electrometer 31 is optional if it is capable of detecting an electric potential of external conductor 32. In the present embodiment, however, the noncontact vibrating-capacitor electrometer described in Japanese Patent Laid-open H07-104019 is employed in a modified performance.

Surface electrometer 31 is mounted on grounded inner conductor 33 through an isolator. Measuring electrode 41 of surface electrometer 31 is supplied with a DC bias voltage (not shown in the figure) and makes up a capacitor associated with probe plate 40. The capacity of the capacitor varies periodically in response to a vibration of chopper electrode 41. In this way, the electrostatic potential of probe plate 41 is taken out as an AC signal from measuring electrode 41. Inner conductor 33 serves to shield surface electrometer 31 from an external electric field.

The amplifier circuit is provided for converting the output of surface electrometer 31 into a low-impedance signal. For this end, it is made up of a source follower driven by FET 43 and operational amplifier 44. The output of surface electrometer 31 is supplied to the gate of FET 43, converted into a low-impedance signal by the source follower, amplified by operational amplifier 44 delivered to control section 34.

Control section 34 receives the output of operational amplifier 44 and computes the electrostatic potential of probe plate 40 with respect to a predetermined reference potential. While the reference potential is arbitrary, it is preferred in most applications that the grounded state of probe plate 40 is referred to as the standard state of the electric potential.

In operation, the output of control section 34 is calibrated beforehand with respect to the standard state of probe plate 40. Upon switching-on the electrometer, chopper electrodes 41 starts vibrating to provide a periodical variation in the capacitance of the capacitor.

Next, the second section of external conductor 32 is brought into contact with a human body, thereby electrically charging the probe plate 40 to be equipotential to the human body. The electric field produced by the charge on probe plate 40 causes an electrostatic induction in measuring electrode 41, thereby causing the variation in the gate potential of FET 43. Since the electric field at measuring electrode 41 is periodically interrupted by chopper electrodes 41, surface electrometer 31 provides an output including a varying component having an amplitude proportionate to the surface charge density of probe plate 40.

The output of surface electrometer 31 is converted into a low-impedance signal by the source follower, amplified by operational amplifier 44 and delivered to control section 34, where the electrostatic potential of probe plate 40 is computed.

In this embodiment, it is advantageous to arrange probe plate 40 and measuring electrode 41 in close positions, because shorter distance between probe plate 40 and measuring electrode 41 makes it possible to measure the electrostatic potential of probe plate 40 in a larger amplitude. However, too short distance will cause a problem that an electric discharge possibly takes place between them. Thus, it is necessary to optimize the distance between probe plate 40 and measuring electrode 41.

The second section of external conductor 32 is preferably shaped like a wristband, because that section has to make a close contact with a part of a human body.

An electrometer of substantially the same construction is applied to measure electrostatic potentials of metal parts in a machining line of a factory. This type of an electrometer is hereinafter referred to as an isolated electrometer.

In a factory, it is necessary to measure the surface potentials of manufacture equipments and metal workbenches.

For example, an electrical leakage is sometimes caused from electrical equipment to a metal workbench. The faulty grounding in manufacturing equipment or a metal workbench is sometimes caused by aging, or by the potential difference between AC or DC equipment and the ground potential.

In such an event, the surface potential of the manufacture equipment or the metal workbench rises. The rise of the surface potential in turn causes an electrostatic charge to be induced and further causes troubles in a manufacture line by the induced charge.

The electrometer of the present embodiment is preferably employed to obviate the above-described problem. The electrometer that is employed for this end can be configured substantially similarly to the electrometer for a human body described above. In this case, however, it is desirable to shape external conductor 32 in a thin plate in order to ensure the contact between external conductor 32 and the manufacturing equipment or the metal workbench.

Figure 4:
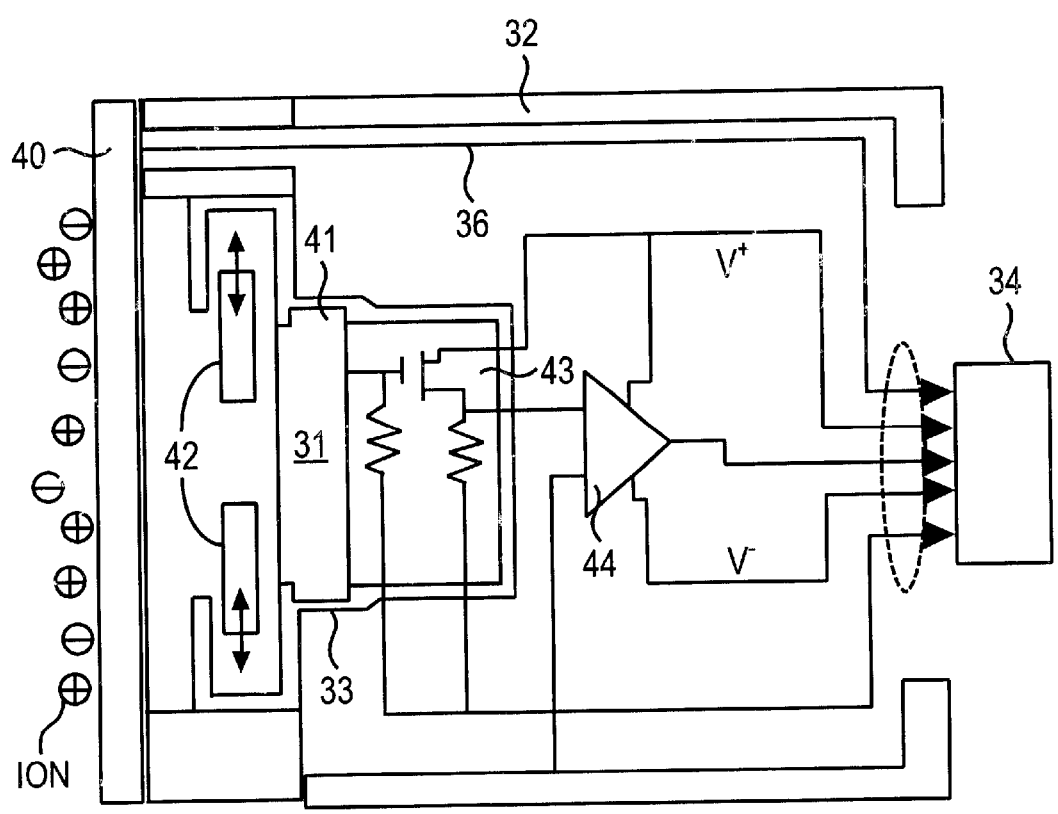
FIG. 4 represents a schematic diagram of a second embodiment of the present invention.

FIG. 4 represents a second embodiment of the present invention. This embodiment is directed to monitoring the ions contained in the ambient air. This type of an electrometer is hereinafter referred to as an air-ion inspecting electrometer.

In this embodiment, probe plate 40 is shaped flat, isolated from plate-like external conductor 32 through an isolator, and connected with bias line 36. Bias line 36 supplies a bias voltage to probe plate 40 from control section 34. External conductor 32 carries inner conductor 33 though an isolator, and inner conductor 33 in turn encloses surface electrometer 31 to shield it from an external electric field. Thus, the difference of the second embodiment from the first embodiment is in probe plate 40 isolated from external conductor 32 and bias line 37 connected to probe plate 40. (In FIG. 4, the gate circuit for FET 43 is explicitly represented with a resistor connected between the gate of FET 43 and ground line 37.)

The detection of an ion concentration in the ambient air is performed allowing for the fact that in a semiconductor manufacture line, for example, the ambient air in the workroom is kept electrically neutral by means of an ionizer. The electrical neutrality of the ambient air allows preventing ions from being accumulated on a substrate surface.

The ionizer is directed to generating two corona discharges to create plus ions and minus ions individually to neutralize the ambient air as a whole. For this end, two high voltages, a plus voltage and a minus voltage with respect to the ground potential, are individually applied to two needle-like electrodes.

The corona discharge generated in the discharge gap between the plus electrode and the ground electrode creates plus ions of air and the corona discharge generated between the minus electrode and the ground electrode creates minus ions.

It is ordinary, however, that an application of a high voltage to an electrode causes ambient dust to attach onto the electrode as well as causes the electrode to wear. There may be no problem if an equal amount of the dust attaches on both electrodes, or if the wear advances in the two electrodes at an equal rate.

If, however, either of the two electrodes wears faster, or different amounts of the ambient dust attach to the individual electrodes, the ambient air experiences a deviation from the charge neutrality. Such a deviation charges the substrate electrically. For this reason, monitoring of the ionizer performance is required.

In operation of the air-ion inspecting electrometer, a high bias voltage is first applied to probe plate 40. After the to-ground capacitor of the probe-plate (the air capacitor made up of probe plate 40 and the ground) is charged, the applied bias voltage is cut off from probe plate 40. The decay in the voltage of probe plate 40 is measured by surface electrometer 31 and the decay time is calculated by control section 34. The concentration of the air ions is identified from the obtained decay time.

Since the decay time depends on the polarizability or the dielectric constant of the ion-containing air as described above and since the surface density of the surface charge induced by the polarized dielectric (polarized air) is a function of the polarizability and the electric field applied to the dielectric (air), the density of the surface charge on probe plate 40 can be identified by a preliminary calibration of the relation between the surface charge on probe plate 40 and the potential applied to probe plate 40 for each decay time specified as a parameter. In this calibration, the surface charge is measured with a coulomb meter.

It is to be noted that the concentration of the air ions can be identified on the basis of the rise time as well by first grounding probe plate 40 and next applying a high voltage thereto.

It is a matter of course that measurements have to be made by applying both a plus high voltage and a minus high voltage to probe plate in order that information concerning both of the plus ions and the minus ions contained in the ambient air can be obtained.

In using the air-ion inspecting electrometer to identify a surface charge of an object, it is also to be noted that the to-ground capacitance of the object in question is substantially equals that of the probe plate.

It is further to be noted that the probe plate of the inspecting electrometer is located in proximity to the object to be measured, and that the surface area of the object substantially equals that of the probe plate.

Concerning the human-body electrometer, the isolated electrometer and the air-ion inspecting electrometer described above, it is preferable that the breakdown charge or the breakdown voltage in each of these electrometers is measured beforehand by means of a coulomb meter and, based on the measured value, a reference value is set up beyond which an alarm is issued.

It is also preferred that at least two of the human-body electrometer, the isolated electrometer and the air-ion inspecting electrometer described above are associated with each other and incorporated in a manufacture line. Since these electrometers can share a control section, the common control section preferably judges the data items provided by the associated electrometers comprehensively and manages to issue an alarm as well as to display the information indicating the location to be repaired.

While the embodiments have been set forth specifically in connection with a manufacture line of a semiconductor, these embodiments can be applied to all of the manufacture lines that run substances susceptible to an electrostatic charge such as an assembly line of semiconductor devices, a manufacture line for mounting semiconductor devices and semiconductor chips on a substrate, an assembly line of a hard disk, and a manufacture and assembly line of an LCD.

It is to be understood, however, that although the characteristics and advantages of the present invention have been set forth in the foregoing description, the disclosure is illustrative only, and changes may be made in the shape, size, and arrangement of the parts within the scope of the appended claims.

What is claimed is:

1. An electrometer comprising: an external electrical conductor with a first section for probing an electric potential of an object of interest and a second section adapted for contacting said object; a surface electrometer for detecting a potential of said first section; a grounded inner electrical conductor isolated from said external electrical conductor for supporting said surface electrometer and shielding it from an external electric field; an amplifier circuit for converting an output of said surface electrometer into a low-impedance signal and amplifying it; and a control section for computing the electrical potential of said object based on an output of said amplifier circuit, wherein said first section is configured to adapt to a measurement by said surface electrometer.

2. An electrometer as claimed in claim 1, wherein said surface electrometer is a noncontact vibrating-capacitor electrometer and said first section is configured as a probe plate to make up a capacitor with a measuring electrode of said noncontact vibrating-capacitor electrometer.

3. An electrometer as claimed in claim 1, wherein said object is a human body and said second section of said external electrical conductor is formed to adaptively contact a predetermined portion of a human body.

4. An electrometer as claimed in claim 1, wherein said object is a semiconductor device under processing in a manufacture line and said second section is formed thin to adaptively contact said object.

5. A manufacture line including at least two of the electrometers as claimed in claim 3, said at least two electrometers sharing said control section, the shared control section receiving data supplied from the individual amplifier circuits, judging comprehensively the received data, and operating to execute a predetermined control based on the comprehensive judgement.

6. A manufacture line including at least two of the electrometers as claimed in claim 4, said at least two electrometers sharing said control section, the shared control section receiving data supplied from the individual amplifier circuits, judging comprehensively the received data, and operating to execute a predetermined control based on the comprehensive judgement.

7. An electrometer comprising: an electrically conductive probe plate supplied with a bias voltage for probing a surface electrostatic charge caused by ambient air ions attracted thereto; an external electrical conductor for shielding the entirety of said electrometer from an external electric field, said external electrical conductor being electrically isolated from said probe plate; a surface electrometer for detecting a potential of said probe plate; an inner electrical conductor electrically isolated from said external electrical conductor for supporting said surface electrometer; an amplifier circuit for converting an output of said surface electrometer into a low-impedance signal and amplifying it; and a control section for computing the ion concentration in the ambient air based on the output of said amplifier circuit, wherein said probe plate is configured to have a capacitance with respect to the ground as well as to adapt to a measurement by said surface electrometer, and wherein the ion concentration is determined by: first applying a high voltage with respect to the ground potential to said probe plate as said bias voltage, next cutting off a supply of said high voltage to said probe plate, detecting the values of a decaying voltage in said probe plate by said surface electrometer, computing a decay time in the voltage of said probe plate and identifying the concentration of the ambient air ions based on said decay time by said control section.

8. An electrometer as claimed in claim 7, wherein a plus high voltage and a minus high voltage are individually applied to said probe plate as a bias voltage.

9. An electrometer as claimed in claim 7, wherein said probe plate has a capacitance with respect to the ground substantially the same as that of the object in question.

10. A manufacture line including at least two of the electrometers as claimed in claim 5, said at least two electrometers sharing said control section, the shared control section receiving data supplied from the individual amplifier circuits, judging comprehensively the received data, and operating to execute a predetermined control based on the comprehensive judgement.

* * * * *